United States Patent
Ono et al.

(10) Patent No.: US 8,148,037 B2
(45) Date of Patent: Apr. 3, 2012

(54) OPTICAL COMPONENT FOR EUVL AND SMOOTHING METHOD THEREOF

(75) Inventors: Motoshi Ono, Tokyo (JP); Mitsuru Watanabe, Tokyo (JP); Masabumi Ito, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 12/858,577

(22) Filed: Aug. 18, 2010

(65) Prior Publication Data
US 2010/0315704 A1    Dec. 16, 2010

Related U.S. Application Data

(63) Continuation of application No. PCT/JP2009/053466, filed on Feb. 19, 2009.

(30) Foreign Application Priority Data

Feb. 19, 2008 (JP) ................................. 2008-037531
Nov. 25, 2008 (JP) ................................. 2008-299647

(51) Int. Cl.
*G03F 1/00*    (2006.01)
*B23K 26/00*   (2006.01)

(52) U.S. Cl. ........................... 430/5; 430/316; 219/121.8

(58) Field of Classification Search ............ 219/121.69, 219/121.8; 430/5; 264/1.36, 1.37
See application file for complete search history.

(56) References Cited

U.S. PATENT DOCUMENTS

| | | |
|---|---|---|
| 5,742,026 A | 4/1998 | Dickinson, Jr. et al. |
| 6,132,843 A | 10/2000 | Kuroda et al. |
| 6,465,272 B1 | 10/2002 | Davis, Jr. et al. |
| 7,585,800 B2 * | 9/2009 | Kawata et al. ............... 501/54 |
| 7,901,843 B2 * | 3/2011 | Sugiyama et al. ............ 430/5 |
| 2002/0110348 A1 | 8/2002 | Sokol et al. |
| 2006/0166109 A1 | 7/2006 | Yan |
| 2010/0068632 A1 | 3/2010 | Ono et al. |

FOREIGN PATENT DOCUMENTS

| | | |
|---|---|---|
| JP | 2008-027992 | 2/2008 |
| WO | 2007/072890 | 6/2007 |

OTHER PUBLICATIONS

SEMI, pp. 37-1102 (2002).
SEMI, pp. 38-1102 (2002).
Alan Stivers et al., vol. 4889, pp. 408-417 (2002).
European Office Action issued on Aug. 30, 2011, in European Patent Application No. 09 712 929.0-1226.
S. Inoue, et al., "Correction between specific heat and change of refractive index formed by laser spot heating of tellurite glass surfaces", Journal of Non-Crystalline Solids 324 (2003) p. 133-141.
K. Takehisa, et al., "EUV mask substrate flatness improvement by laser irradiation", Proceeding of SPIE Sep. 2007, p. 673051-1-5.

* cited by examiner

*Primary Examiner* — Stephen Rosasco
(74) *Attorney, Agent, or Firm* — Oblon, Spivak, McClelland, Maier & Neustadt, L.L.P.

(57) ABSTRACT

The present invention is to provide a method for smoothing the optical surface having a concave defect of an optical component for EUVL.

The present invention relates to a method for smoothing the optical surface of an optical component for EUVL, comprising irradiating, with an excimer laser having a wavelength of 250 nm or less with a fluence of 0.5 to 2.0 $J/cm^2$, the optical surface having a concave defect of an optical component for EUV lithography (EUVL), the optical component being made of a $TiO_2$-containing silica glass material comprising $SiO_2$ as a main component.

17 Claims, 2 Drawing Sheets

OPTICAL COMPONENT FOR EUVL AND SMOOTHING METHOD THEREOF

TECHNICAL FIELD

The present invention relates to a method for smoothing an optical component for EUV lithography (hereinafter referred to as "EUVL"). More specifically, the present invention relates to a method for smoothing the optical surface having a concave defect such as pit or scratch of an optical component for EUVL (hereinafter referred to as "the smoothing method of the present invention").

Also, the present invention relates to an optical component for EUVL obtained by the smoothing method of the present invention.

BACKGROUND ART

In the lithography technology, an exposure tool for manufacturing an integrated circuit by transferring a minute circuit pattern onto a wafer has hitherto been widely utilized. With the trend toward a higher degree of integration and a higher function of an integrated circuit, the refinement of the integrated circuit is advancing. The exposure tool is hence required to form a circuit pattern image with high resolution on a wafer surface at a long focal depth, and shortening of the wavelength of an exposure light source is being advanced. The exposure light source advances from the conventional g-line (wavelength: 436 nm), i-line (wavelength: 365 nm) or KrF excimer laser (wavelength: 248 nm), and an ArF excimer laser (wavelength: 193 nm) is coming to be employed. Also, in order to cope with a next-generation integrated circuit whose circuit line width will become not more than 70 nm, an immersion lithography technique and a double exposure technique, each using an ArF excimer laser, are regarded as being leading. However, it is considered that even these techniques would be able to cover only the generation with a line width of up to 45 nm.

Under such a technical trend, a lithography technique using EUV light as a next-generation exposure light source (EUVL) is considered to be applicable over the 32-nm and subsequent generations and is attracting attention. EUV light indicates light with a wavelength band in a soft X-ray region or a vacuum ultraviolet region, and this is specifically light at a wavelength of approximately from 0.2 to 100 nm. At present, studies are being made on light at 13.5 nm as the lithography light source. The exposure principle of the EUV lithography is the same as the conventional lithography in that a mask pattern is transferred using a projection optical system. However, since there is no material capable of transmitting light therethrough in the EUV light energy region, a refractive optical system cannot be used. Accordingly, the optical systems are all reflecting optical systems.

The reflecting optical system for use in EUVL includes, for example, a reflective type mask (hereinafter, in the context of the present invention, referred to as a "mask for EUVL") and a mirror such as light collection optical system mirror, illumination optical system mirror and projection optical system mirror (hereinafter, in the context of the present invention, referred to as a "mirror for EUVL").

The mask blank for EUVL used in the production of a mask for EUVL is basically composed of (1) an optical component for EUVL (for example, a glass substrate), (2) a reflective multilayer film formed on the optical surface of the optical component for EUVL and (3) an absorber layer formed on the reflective multilayer film. On the other hand, the mirror for EUVL is basically composed of (1) an optical component for EUVL (for example, a glass substrate) and (2) a reflective multilayer film formed on the optical surface of the optical component for EUVL.

As for the optical component for EUVL, a material having a low thermal expansion coefficient not causing a strain even under irradiation of EUV light is required and use of a glass having a low thermal expansion coefficient or a glass-ceramics having a low thermal expansion coefficient is being studied. In the following, in the context of the present invention, the glass having a low thermal expansion coefficient and the glass-ceramics having a low thermal expansion coefficient are collectively referred to as a "low expansion glass" or an "extremely low expansion glass".

As for such a low expansion glass and an extremely low expansion glass, a silica glass having added thereto a dopant for decreasing the thermal expansion coefficient of the glass is being most widely used. In addition, the dopant added for the purpose of decreasing the thermal expansion coefficient of the glass is typically $TiO_2$. Specific examples of the silica glass where $TiO_2$ is added as a dopant include ULE (registered trademark) Code 7972 (produced by Corning) and Product No. AZ6025 produced by Asahi Glass Co., Ltd.

As for the reflective multilayer film, a film having a structure where a plurality of materials differing in the refractive index in the wavelength region of EUV light as the exposure light are periodically laminated in the nm order is used, and this is most commonly a reflective multilayer film formed by alternately laminating a molybdenum (Mo) layer as a layer having a high refractive index in the wavelength region of EUV light (high refractive index layer) and a silicon (Si) layer as a layer having a low refractive index in the wavelength region of EUV light (low refractive index layer) and thereby enhanced in the light reflectance when irradiating the layer surface with EUV light. For the absorber layer, a material having a high absorption coefficient for EUV light, specifically, a material comprising, for example, Cr or Ta as a main component, is used.

If minute irregularities are present on the optical surface of an optical component for EUVL, this adversely affects the reflective multilayer and absorber layer formed on the optical surface. For example, if minute irregularities are present on the optical surface, the periodic structure of the reflective multilayer film formed on the optical surface is disturbed and when EUVL is performed using a mask or mirror for EUVL produced using the optical component for EUVL, the desired pattern may be partially lost or an extra pattern other than the desired pattern may be formed. The disorder of the periodic structure of the reflective multilayer film, which is ascribable to irregularities present on the optical surface, is a serious problem called a phase defect and irregularities larger than a predetermined size are preferably not present on the optical surface.

Non-Patent Documents 1 and 2 describe requirements regarding the defects of a mask for EUVL and a mask blank for EUVL, and these requirements regarding the defect are very severe. In Non-Patent Document 1, it is indicated that the presence of a defect exceeding 50 nm on a substrate causes a disorder in the structure of the reflective multilayer film, giving rise to an unexpected profile of the pattern projected on the resist on an Si wafer, and is not allowed. Also, in Non-Patent document 1, it is indicated that for preventing an increase in the line edge roughness of a pattern projected on the resist on an Si wafer, the surface roughness of the substrate must be less than 0.15 nm in terms of RMS (root-mean-square roughness). In Patent Document 2, it is indicated that on a mask blank coated with a reflective multilayer film, which is used for EUV lithography, the presence of a defect exceeding 25 nm is not allowed.

Also, Non-Patent Document 3 describes what size of a defect on a substrate is likely to be transferred. Non-Patent Document 3 indicates that a phase defect may change the line width of the printed image. More specifically, it is taught that a phase defect having a surface bump with a height of 2 nm and FWHM (full width at half maximum) of 60 nm is a size marking the border as to whether the defect is likely to be transferred or not and a phase defect in this size causes an unallowable change of 20% (on a mask, 140 nm) in the line width for a line of 35 nm.

Furthermore, Patent Document 1 describes a method for repairing the concave-convex portion by collecting laser light in the vicinity of the surface or back surface of the concave-convex portion of a mask substrate for EUVL.

Non-Patent Document 1: "Specification for extreme ultraviolet lithography mask blank", *SEMI*, pp. 37-1102 (2002)

Non-Patent Document 2: "Specification for absorbing film stacks and multilayers on extreme ultraviolet lithography mask blanks", *SEMI*, pp. 38-1102 (2002)

Non-Patent Document 3: Alan Stivers, et al., "Evaluation of the Capability of a Multibeam Confocal Inspection System for Inspection of EUVL Mask Blanks", *SPIE*, Vol. 4889, pp. 408-417 (2002)

Patent Document 1: JP-A-2008-027992

DISCLOSURE OF INVENTION

Technical Problem

Among minute concave-convex portion present on the optical surface, a convex defect such as particle (e.g., foreign substance, fiber) or bump of the substrate itself can be removed by a conventional wet cleaning method using hydrofluoric acid or aqueous ammonia or by brush cleaning, precision polishing or the like.

However, a concave defect such as pit or scratch cannot be removed by such a method. Moreover, if a wet cleaning method using hydrofluoric acid or aqueous ammonia is employed for removing a convex defect, the optical surface needs to be slightly etched so as to remove the convex defect by lift-off and a new concave defect may be produced on the optical surface. Even in the case of employing brush cleaning for removing the convex defect, a new concave defect may be produced on the optical surface.

Also, the method described in Patent Document 1 has a problem that a minute irregularity defect can be hardly treated because by specifying the concave-convex portion, the position on which laser light is focused must be changed to the vicinity of the substrate surface or the vicinity of the substrate back surface depending on whether the defect is a concave part or a convex part.

For solving these problems in conventional techniques, an object of the present invention is to provide a method for smoothing the optical surface having a concave defect such as pit or scratch of an optical component for EUVL.

Technical Solution

As a result of intensive studies to attain the above-described object, the present inventors have found that by irradiating, with an excimer laser having a specific wavelength region at a specific fluence, the optical surface having a concave defect can be smoothed while minimizing the adverse effect by the irradiation with an excimer laser, such as worsening of flatness or deterioration in terms of surface roughness.

The present invention has been accomplished based on this finding by the present inventors and provides a method for smoothing an optical surface of an optical component for EUVL, comprising irradiating, with an excimer laser having a wavelength of 250 nm or less with a fluence of 0.5 to 2.0 J/cm$^2$, an optical surface having a concave defect of an optical component for EUV lithography (EUVL), the optical component being made of a TiO$_2$-containing silica glass material comprising SiO$_2$ as a main component (the smoothing method of the present invention).

In the smoothing method of the present invention, it is preferred that the irradiation with the excimer laser is carried out with a fluence of 0.7 to 2.0 J/cm$^2$, thereby attaining a concave defect depth repair rate of the optical surface, defined by the following formula, being 50% or more:

Concave defect depth repair rate (%)=((depth of concave defect (PV value) before excimer laser irradiation)−(depth of concave defect (PV value) after excimer laser irradiation))/(depth of concave defect (PV value) before excimer laser irradiation)×100.

In the smoothing method of the present invention, it is preferred that the irradiation with the excimer laser, the optical surface having a concave defect with a depth of more than 2 nm and 10 nm or less is carried out with a fluence of 0.7 to 2.0 J/cm$^2$, thereby obtaining an optical component for EUVL satisfying the following requirements (1) to (3):

(1) the optical surface after the excimer laser irradiation is free from a concave defect with a depth of more than 2 nm, (2) the optical component after the excimer laser irradiation has a flatness of 50 nm or less, and (3) the optical surface after the excimer laser irradiation has a surface roughness (RMS) of 0.15 nm or less.

In the smoothing method of the present invention, it is preferred that the excimer laser irradiation is carried out over the entire optical surface of the optical component.

In the smoothing method of the present invention, it is preferred that the optical component has a TiO$_2$ concentration of from 3 to 10 mass %.

In the smoothing method of the present invention, it is preferred that the excimer laser has a pulse width of 100 nsec or less.

In the smoothing method of the present invention, it is preferred that the excimer laser irradiation is carried out such that the number of shots at each irradiation area becomes 10 or more.

Here, the number of shots indicates the number of times the excimer laser irradiation is carried out over the same portion, and the number of shots when the excimer laser for the irradiation is in the form of a line beam, and the excimer laser irradiation is carried out while scanning the optical surface with the line beam either by moving the line beam relative to the optical surface or by moving the optical surface relative to the line beam is defined by repetition rate of pulse laser×beam width in scanning direction÷scanning speed.

In the smoothing method of the present invention, it is preferred that the excimer laser for the irradiation is in the form of a line beam, and the excimer laser irradiation is carried out while scanning the optical surface with the line beam either by moving the line beam relative to the optical surface or by moving the optical surface relative to the line beam.

In the smoothing method of the present invention, it is preferable to further comprise irradiating a back surface of the optical surface opposite to the optical surface with an excimer laser having a wavelength of 250 nm or less with a fluence of 0.5 to 2.0 J/cm².

In this case, the excimer laser irradiation of the back surface is preferably carried out over the entire back surface.

In the smoothing method of the present invention, it is preferable to satisfy the relationship of the following formula:

$$0.5 \leq F_1/F_2 \leq 1.5$$

wherein $F_1$ represents the fluence in the excimer laser irradiation of the optical surface, and $F_2$ represents the fluence in the excimer laser irradiation of the back surface.

In the smoothing method of the present invention, it is preferred that the excimer laser for the irradiation of the back surface has a pulse width of 100 nsec or less.

In the smoothing method of the present invention, it is preferred that the excimer laser irradiation of the back surface is carried out such that the number of shots at each irradiation area becomes 10 or more.

In the smoothing method of the present invention, it is preferred that the excimer laser for the irradiation of the back surface is in the form of a line beam, and the excimer laser irradiation of the back surface is carried out while scanning the back surface with the line beam either by moving the line beam relative to the back surface or by moving the back surface relative to the line beam.

In the smoothing method of the present invention, it is preferred that the excimer laser irradiation of the optical surface is carried out in the state of the optical component being heated at 100 to 1,050° C.

Also, the present invention provides an optical component for EUVL obtained by the method of the smoothing method of the present invention comprising irradiating only an optical surface, composed of a surface layer containing the optical surface, a surface layer containing the back surface, and the remaining inside part, wherein the surface layer containing the optical surface has a fictive temperature that is higher by 30° C. or more than fictive temperatures of the surface layer containing the back surface and of the remaining inside part.

Furthermore, the present invention provides an optical component for EUVL obtained by the smoothing method of the present invention comprising irradiating an optical surface and a back surface, composed of a surface layer containing the optical surface, a surface layer containing the back surface, and the remaining inside part, wherein the surface layer containing the optical surface and the surface layer containing the back surface each has a fictive temperature that is higher by 30° C. or more than a fictive temperature of the remaining inside part.

According to the smoothing method of the present invention, by irradiating, with an excimer laser having a wavelength of 250 nm or less with a fluence of 0.5 to 2.0 J/cm², an optical surface having a concave defect of an optical component for EUV lithography (EUVL), the optical surface can be smoothed while minimizing the adverse effect by the irradiation with an excimer laser, such as worsening of flatness or deterioration in terms of surface roughness.

DESCRIPTION OF REFERENCE NUMERALS AND SIGNS

Figure 1:
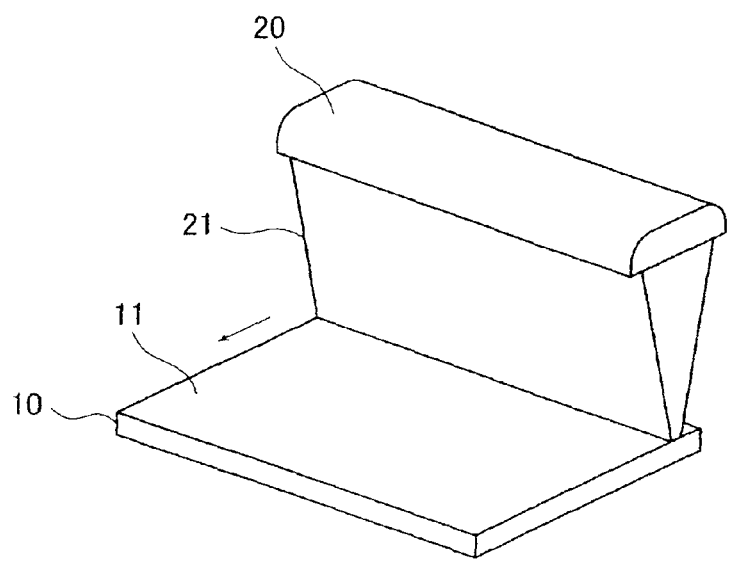
FIG. 1 is a schematic view illustrating the state of irradiating the optical surface of an optical component for EUVL with an excimer laser in the form of a line beam.

10: Optical component for EUVL
11: Optical surface
20: Cylindrical lens
21: Line beam (excimer laser)

BEST MODE FOR CARRYING OUT THE INVENTION

The smoothing method of the present invention is described below.

The smoothing method of the present invention is a method of irradiating, with an excimer laser having a wavelength of 250 nm or less with a fluence of 0.5 to 2.0 J/cm², the optical surface having a concave defect of an optical component for EUVL, thereby smoothing the optical surface.

The optical component for EUVL, to which the smoothing method of the present invention is applied, is made of a silica glass material comprising $SiO_2$ as a main component, where $TiO_2$ is added as a dopant for decreasing the thermal expansion coefficient.

The $TiO_2$ concentration in the silica glass material is not particularly limited as long as the thermal expansion coefficient of the silica glass material can be made low enough to allow use as an optical component for EUVL, but the concentration is preferably from 3 to 10 mass %. When the $TiO_2$ concentration is in this range, the thermal expansion coefficient of the silica glass material becomes sufficiently low, and the material changes into a low expansion glass having a thermal expansion coefficient at 20° C. of 0±30 ppb/° C., preferably an extremely low expansion glass having a thermal expansion coefficient at 20° C. of 0±10 ppb/° C.

In the silica glass material, a dopant other than $TiO_2$ may be added as a dopant for decreasing the thermal expansion coefficient. Examples of such a dopant include $SnO_2$. In the case of adding $SnO_2$ as a dopant, the $SnO_2$ concentration in the silica glass material is not particularly limited as long as the thermal expansion coefficient of the silica glass material can be made low enough to allow use as an optical component for EUVL, but the concentration is preferably from 0.1 to 10 mass %. The $SnO_2$ concentration when adding $SnO_2$ as a dopant is more preferably 0.3 mass % or more, still more preferably 0.5 mass % or more. Also, the $SnO_2$ concentration is more preferably 5 mass % or less, still more preferably 3 mass % or less.

Specific examples of the low expansion glass and extremely low expansion glass, where $TiO_2$ is added as a dopant in a concentration above, include ULE (registered trademark) Code 7972 (produced by Corning).

In the optical component for EUVL, its optical surface must have high smoothness and high flatness. Specifically, the optical surface is required to have a smooth surface with the surface roughness in terms of RMS (root-mean-square roughness) being 0.15 nm or less and a flatness of 50 nm or less. Even when these required values are satisfied, a localized concave defect called pit or scratch is sometimes still present on the optical surface.

The optical component for EUVL preferably has excellent resistance to a cleaning solution that is used, for example, in the cleaning after producing a mask blank for EUVL or a mirror for EUVL or in the cleaning of a mask for EUVL after patterning the mask blank for EUVL.

Also, the optical component for EUVL preferably has high rigidity so as to prevent deformation due to film stress of a reflective multilayer film and an absorber layer formed on the optical surface. In particular, the optical component preferably has a high specific rigidity of $3\times10^7$ m$^2$/s$^2$ or more.

The size, thickness and the like of the optical component for EUVL vary depending on the use but, in the case of use as a mask blank for EUVL, these must be appropriately determined, for example, according to the design values of the mask for EUVL. In this case, specific examples of the optical component include a mask blank having an outside dimension of about 6 inch (152.4 mm) square and a thickness of about 0.25 inch (6.3 mm).

In practicing the smoothing method of the present invention, the optical surface of a previously prepared optical component for EUVL is first polished with a polishing abrasive grain such as cerium oxide, zirconium oxide and colloidal silica, and the optical surface is then cleaned with an acidic solution such as hydrofluoric acid, hydrosilicofluoric acid and sulfuric acid, an alkali solution such as aqueous ammonia, or pure water, and dried. In the case where a particle such as foreign substance or fiber is present on the optical surface or where a convex defect such as pump is present on the optical component itself, it is removed by the above-described procedure.

The smoothing method of the present invention is preferably used for an optical surface from which a convex defect is removed by performing the surface polishing and cleaning according to the procedure above.

In the case where the size of the concave defect present on the optical surface is very small, this does not adversely affect the mask blank for EUVL or mirror for EUVL produced using the optical component for EUVL, but when a concave defect larger than a certain size is present on the optical surface, the concave defect sometimes appears on the surface of the reflective multilayer film or absorber layer formed on the optical surface and works out to a defect of the mask blank for EUVL or mirror for EUVL produced using the optical component.

The size of the defect present on the optical surface, which works out to a defect of the mask blank for EUVL or mirror for EUVL, cannot be indiscriminately indicated, because this is affected by the diameter, depth and shape of the concave defect and the usage of the optical component, but in the case of an optical component used for the production of a mask blank for EUVL, if a concave defect with a depth exceeding 2 nm is present on the optical surface, a concave defect sometimes appears on the surface of the reflective multilayer film or absorber layer formed on the optical surface and works out to a defect of the mask blank for EUVL or even if not appear on the surface of the reflective multilayer film or absorber layer, the structure in such a film is disturbed to cause a phase defect in some cases. When the depth becomes 2 nm or less, the defect is not resolved and does not work out to a defect in practice. Therefore, the optical surface is preferably smoothed by using the substrate smoothing method of the present invention.

Meanwhile, a large concave defect with a depth of more than 10 nm is suitably eliminated by the polishing performed for removing a foreign substance present on the optical surface or a convex defect such as bump, in view of the time, cost and the like required for the processing.

Accordingly, the smoothing method of the present invention is preferably used for an optical component for EUVL having a concave defect with a depth of more than 2 nm and 10 nm or less on the optical surface.

As for the mechanism in the smoothing method of the present invention where the optical surface having a concave defect is smoothed by irradiating, with an excimer laser having a wavelength of 250 nm or less with a fluence of 0.5 to 2.0 J/cm$^2$, the optical surface, it is presumed that the silica glass around the concave defect is heated upon irradiation with the excimer laser and reflowed to fill the concave defect and the optical surface is thereby smoothed.

The reason why the present inventors have presumed in this way is because the fictive temperature of the surface layer containing the optical surface irradiated by the excimer laser rises and becomes high as compared with the fictive temperature of other sites of the optical component, that is, the inside (in comparison with the surface layer) of the optical component or the back surface side (surface layer containing the back surface) with respect to the optical surface. The depth of the surface layer, where the fictive temperature rises by the irradiation with an excimer laser, varies depending on the heat diffusion distance from the irradiation area and the penetration depth of the laser beam, but in the case of using an excimer laser at a wavelength of 250 nm or less with a pulse width of 100 nsec or less, the depth is 20 μm or less.

In view of reflow of the silica glass around the concave defect, the fictive temperature of the surface layer containing the optical surface irradiated by the excimer laser preferably becomes higher by 30° C. or more, more preferably by 200° C. or more, still more preferably by 400° C. or more, especially preferably by 600° C. or more, than the fictive temperature of other sites of the optical component, that is, the inside of the optical component or the back surface side (surface layer containing the back surface) with respect to the optical surface.

Also, in view of reflow of the silica glass around the concave defect, the fictive temperature of the surface layer containing the optical surface irradiated by the excimer laser is preferably 1,550° C. or more, more preferably 1,650° C. or more, still more preferably 1,700° C. or more, especially preferably 1,750° C. or more.

In the smoothing method of the present invention, a laser in the wavelength region giving a high absorption coefficient for a material used in the optical component for EUVL needs to be used. An excimer laser at a wavelength of 250 nm or less, such as KrF excimer laser (wavelength: 248 nm), ArF excimer laser (wavelength: 193 nm) and F$_2$ excimer laser (wavelength: 157 nm), exhibits a high absorption coefficient of 0.017 μm$^{-1}$ or more for a silica glass material where TiO$_2$ is added as a dopant (from 3 to 10 wt %), and moreover, this excimer laser is a high output laser and is suitable as a laser for use in the smoothing method of the present invention. Furthermore, the excimer laser at a wavelength of 250 nm or less is a pulse laser usually having a pulse width of 100 nsec or less and this is advantageous in that the heat diffusion distance at the irradiation area is short and since only the surface layer containing the optical surface is heated but the inside of the optical component is not heated, worsening of flatness or deformation of the substrate due to stress or a problem such as birefringence is scarcely incurred.

If the fluence of the excimer laser is less than 0.5 J/cm$^2$, the surface layer containing the optical surface is not sufficiently heated and the glass around the concave defect is not reflowed, failing in smoothing the optical surface, whereas if the fluence of the excimer laser exceeds 2.0 J/cm$^2$, this causes a problem such as serious deterioration in terms of surface roughness of the optical surface or unacceptable worsening of flatness of the optical component. Also, the fluence of the excimer laser is more preferably from 0.7 to 2.0 J/cm² because of the following reasons.

When the optical surface having a concave defect is irradiated by an excimer laser at a wavelength of 250 nm or less with a fluence of 0.7 to 2.0 J/cm², this is particularly preferred, because the concave defect depth repair rate for the optical surface, defined by the following formula, becomes 50% or more:

Concave defect depth repair rate (%)=((depth of concave defect (PV value) before excimer laser irradiation)−(depth of concave defect (PV value) after excimer laser irradiation))/(depth of concave defect (PV value) before excimer laser irradiation)×100.

The concave defect depth repair rate for the optical surface is preferably 50% or more, more preferably 70% or more, still more preferably 90% or more.

In the smoothing method of the present invention, the preferred range of the fluence of the excimer laser by which the optical surface is irradiated varies depending on the wavelength region of the excimer laser used, but in the case of a KrF excimer laser (wavelength: 248 nm), the fluence is preferably from 0.9 to 1.2 J/cm², more preferably from 0.95 to 1.15 J/cm², still more preferably from 0.95 to 1.1 J/cm². In the case of an ArF excimer laser (wavelength: 193 nm), the fluence is preferably from 0.5 to 1.1 J/cm², more preferably from 0.7 to 1.1 J/cm², still more preferably from 0.75 to 1.05 J/cm², especially preferably from 0.8 to 1.0 J/cm².

As for the excimer laser by which the optical surface is irradiated, a laser having a short pulse width is preferably used, because the heat diffusion distance at the irradiation area becomes short. In this respect, an excimer laser having a pulse width of 100 nsec or less is preferred, an excimer laser having a pulse width of 50 nsec or less is more preferred, and an excimer laser having a pulse width of 30 nsec or less is still more preferred.

In the smoothing method of the present invention, even when the irradiation with the excimer laser is carried out such that the number of shots at each irradiation area becomes 1, the optical surface can be smoothed. However, for raising the effect of reflowing the silica glass around the concave defect and thereby smoothing the optical surface, the excimer laser irradiation is preferably carried out such that the number of shots at each irradiation area becomes 10 or more. The number of shots is more preferably 50 or more, still more preferably 100 or more. However, it must be noted that when the number of shots at each irradiation area is increased, a longer time is required for the irradiation of the excimer laser on the optical surface. Although depending on the pulse width of the excimer laser, the number of shots at each irradiation area is preferably 1,000 or less, more preferably 500 or less, still more preferably 300 or less. The number of shots at each irradiation area can be adjusted by the repetition rate of the excimer laser and the moving rate of the excimer laser relative to the optical surface or the scanning speed of the optical surface relative to the excimer laser.

Smoothing of the optical surface by the excimer laser irradiation can also be achieved by irradiating with the excimer laser, out of the optical surface, only the area where a concave defect is present. However, it takes so much time and is not practical to specify the position of a concave defect present on the optical surface and irradiate the area where the concave defect is present with the excimer laser. This is a non-negligible problem, given that a plurality of concave defects are usually present on the optical surface and since different devices are usually used for specifying the position of a concave defect and irradiating with an excimer laser, displacement may occur when irradiating the specified concave defect with the excimer laser.

On the other hand, when the excimer laser irradiation is carried out over the entire optical surface, the position of a concave defect present on the optical surface need not be specified and even when a plurality of concave defects are present on the optical surface, the optical surface can be smoothed by one operation, so that smoothing of the optical surface can be performed in a short time.

Furthermore, in the case where a very small-size concave defect which cannot be detected because of its size being less than the detection limit of a defect inspection machine is present, this may cause a trouble in the production of a mask blank for EUVL, but by irradiating the entire optical surface with the excimer laser, a concave defect in a small size undetectable by the inspection of the optical surface can also be eliminated.

For these reasons, in the smoothing method of the present invention, the excimer laser irradiation is preferably carried out over the entire optical surface. In the smoothing method of the present invention, the irradiation with the excimer laser having a wavelength of 250 nm or less is carried our with a fluence of 0.5 to 2.0 J/cm² and therefore, even when the excimer laser irradiation is carried out over the entire optical surface, this does not cause a problem such as serious deterioration in terms of surface roughness of the optical surface or unacceptable worsening of flatness.

It must be noted that even when a concave defect is present on the optical surface of an optical component for EUVL, the defect sometimes becomes no problem in use. For example, in the case of an optical component used as a mask blank for EUVL, even on the optical surface, when the concave defect is present in a portion other than the portion working out to an exposure region for patterning in the mask blank for EUVL, this does not become a problem in use. For example, the outer edge part or the like of the optical surface comes under the portion.

Also, even on the optical surface of an optical component for EUVL, when the concave defect is present in a portion that is gripped by a clamp or the like when fixing the optical component to a film-forming apparatus or an exposure apparatus, this does not become a problem in use.

Furthermore, even on the optical surface of an optical component for EUVL, the irradiation with the excimer laser need not be carried out a portion where the presence of a concave defect does not become a problem in use of the optical component.

However, the ratio of such a site occupying in the optical surface is very small and considering the advantage when irradiating the entire optical surface with the excimer laser, the excimer laser irradiation is preferably carried out at least on 88% or more (area ratio), more preferably 92% or more (area ratio), still more preferably 95% or more (area ratio), of the optical surface.

As described above, in the smoothing method of the present invention, the irradiation with the excimer laser is preferably carried out over the entire optical surface, but it is practically impossible to irradiate the entire optical surface of an optical component of EUVL with the excimer laser with the above-described fluence by one irradiation. This is apparent also from the fact that the outer dimension of the mask blank for EUVL is about 6 inch (152.4 mm) square. Accordingly, for irradiating the entire optical surface of an optical component for EUVL with the excimer laser, the excimer laser beam needs to be moved relative to the optical surface or the optical surface needs to be moved relative to the excimer laser beam.

The method for moving the optical surface relative to the excimer laser beam or moving the optical surface relative to the excimer laser light is not particularly limited, but it is preferred to, as illustrated in FIG. 1, scan the optical surface 11 of an optical component 10 for EUVL with the excimer laser as a line beam 21 either by moving the line beam 21 relative to the optical surface 11 of the optical component 10 for EUVL or moving the line beam 21 relative to the optical surface 11, because uniform irradiation of the entire optical surface 11 with the excimer laser is facilitated and the irradiation with the excimer laser can be carried out over the entire optical surface 11 in a short time. Moving the optical surface 11 relative to the line beam 21 need not involve driving of an optical system and is more preferred.

In FIG. 1, a line beam 21 having the same length as the long side of the optical surface 11 of the optical component 10 for EUVL is moved in the longitudinal direction in the figure. This is preferred because the irradiation of the entire optical surface 11 of the optical component 10 for EUVL with the excimer laser is carried out by moving the line beam 21 once in the longitudinal direction in the figure. However, the present invention is not limited thereto, and a line beam in a length shorter than the long side of the optical surface 11 may be used. In this case, the optical surface 11 of the optical component 10 for EUVL is divided into a plurality of regions according to the length of the line beam, and the line beam is moved for each region. In addition, here, the excimer laser irradiation is carried out doubly in the boundary portion between adjacent regions, but the effect on the optical surface by the overlapped irradiation of the excimer laser is minor and there arises no problem in particular. Rather, the problem is that the time required for irradiation of the entire optical surface is increased by doubly irradiating with the excimer laser, but when the width of the portion doubly irradiated is limited to about 3 mm, no problem arises in particular. The same applies to the case of moving the optical surface 11 relative to the line beam 21.

In FIG. 1, as for the optical system for irradiation as the line beam 21, a cylindrical lens 20 is used. However, the optical system to be used is not limited thereto as long as it can be used as the line beam 21 and, for example, a diffractive optical element (DOE) may be used.

In the smoothing method of the present invention, the excimer laser irradiation may be carried out over the optical surface in the state of the optical component for EUVL being heated. As described above, in the smoothing method of the present invention, it is considered that the glass around a concave defect is heated by the excimer laser irradiation and reflowed to fill the concave defect and the optical surface is thereby smoothed. In the case where the excimer laser irradiation is carried out over the optical surface in the state of the optical component being heated, the fluence of the excimer laser necessary for reflowing the glass around a concave part is expected to be reduced.

In the smoothing method of the present invention, an excimer laser irradiation is carried out over the optical surface and therefore, deterioration in terms of surface roughness of the optical surface or worsening of flatness of the optical component may occur. However, in the smoothing method of the present invention, the irradiation with the excimer laser is carried out with a fluence of 0.5 to 2.0 J/cm$^2$ and therefore, deterioration in terms of surface roughness of the optical surface or worsening of flatness of the optical component, if any, is minor.

In the case of irradiating the optical surface with the excimer laser in the state of the optical component for EUVL being heated, the fluence of the excimer laser necessary for reflowing the silica glass around the concave defect is reduced and this is expected to make minimal the deterioration in terms of surface roughness of the optical surface or the worsening of flatness of the optical component or furthermore prevent the deterioration in terms of surface roughness of the optical surface or the worsening of flatness of the optical component.

In the case where for the purpose of obtaining the effect above, the excimer laser irradiation is carried out over the optical surface in the state of the optical component for EUVL being heated, the optical component is preferably heated at 100° C. or more, more preferably at 300° C. or more, still more preferably at 500° C. or more. However, if the heating temperature of the optical component is excessively high, there arises a problem such as deformation of or effect of stress on the substrate or increase in the processing time due to cooling. Therefore, the heating temperature is preferably 1,050° C. or less, more preferably 900° C. or less, still more preferably 800° C. or less.

As described above, in the smoothing method of the present invention, minor worsening of flatness may be caused in the optical component by the irradiation of an excimer laser on the optical surface. In the case of an optical component for EUVL, the acceptable range for the flatness is very narrow and therefore, worsening of flatness produced in the optical component is preferably reduced as much as possible.

The worsening of flatness produced in the optical component can be reduced as much as possible by adjusting the irradiation conditions with the excimer laser, but given that the cause of generating worsening of flatness is irradiation with a high-energy excimer laser on the optical surface, when the excimer laser irradiation is carried out the back surface opposite to the optical surface (hereinafter referred to as "the back surface") after irradiating the optical surface with the excimer laser and the flatness is thereby worsened toward the direction opposite from the worsening direction of the flatness generated when the optical surface is irradiated by the excimer laser, worsening of flatness of the optical component at the end of the smoothing method of the present invention can be reduced or furthermore, worsening of flatness of the optical component can be eliminated.

In addition, as described above, in the smoothing method of the present invention, the excimer laser irradiation is preferably carried out over the entire optical surface and therefore, in the case of irradiating the back surface with the excimer laser, the excimer laser irradiation is preferably carried out over the entire back surface. However, as for the portion of the optical surface, which is not irradiated by the excimer laser, because of the reasons above, the back surface thereof also need not to be irradiated by the excimer laser.

Furthermore, in the case where the extent of worsening of flatness generated at the irradiation of the optical surface with the excimer laser can be predicted, the back surface may be previously irradiated by the excimer laser to worsen the flatness toward the direction from the worsening direction of the flatness, which is expected to occur when irradiating the optical surface with the excimer laser. Also by such a treatment, worsening of flatness of the optical component at the end of the smoothing method of the present invention can be reduced or furthermore, worsening of flatness of the optical component can be eliminated.

In the case where the back surface is irradiated by the excimer laser for the purpose of reducing or eliminating worsening of flatness of the optical component, the irradiation conditions are preferably on the same level as those for the optical surface.

In terms of the fluence in the excimer laser, the fluence $F_1$ in the excimer laser irradiation of the optical surface and the fluence $F_2$ in the excimer laser irradiation of the back surface preferably satisfy the relationship of the following formula (1), more preferably the following formula (2), and still more preferably, $F_1$ and $F_2$ are substantially the same.

$$0.5 \leq F_1/F_2 \leq 1.5 \quad (1)$$

$$0.9 \leq F_1/F_2 \leq 1.1 \quad (2)$$

In the case of irradiating the back surface with the excimer laser, the fictive temperature of the surface layer containing the back surface irradiated by the excimer laser also rises. The depth of the surface layer, where the fictive temperature rises, and to what extent the fictive temperature rises are the same as those descried above for the excimer laser irradiation on the optical surface. Accordingly, when the back surface is also irradiated by the excimer laser, the fictive temperature of the optical component after the excimer laser irradiation becomes high in the surface layer containing the optical surface and the surface layer containing the back surface, as compared with the inside of the optical component.

As described above, in the smoothing method of the present invention, the irradiation of the optical surface having a concave defect, whereby the optical surface can be smoothed, with an excimer laser having a wavelength of 250 nm or less is carried out with a fluence of 0.5 to 2.0 J/cm², preferably a fluence of 0.7 to 2.0 J/cm². Specifically, it is preferred that a concave defect with a depth of more than 2 nm is not present on the optical surface after the excimer laser irradiation.

As described above, in the case of an optical component for use in the production of a mask blank for EUVL, when a concave defect with a depth of more than 2 nm is present on the optical surface, the concave defect sometimes appears on the surface of the reflective multilayer film or absorber layer formed on the optical surface and works out to a defect of the mask blank for EUVL or even if the concave defect does not appear on the surface of the reflective multilayer film or absorber layer, the structure in such a film is disturbed to cause a phase defect in some cases.

According to the substrate smoothing method of the present invention, the optical surface of an optical component for EUVL becomes an optical surface excellent in the smoothness without allowing the presence of a concave defect giving rise to a problem in the production of a mask blank for EUVL or a mirror of EUVL.

The optical surface after the excimer laser irradiation is preferably free from a concave defect with a depth of 1.5 nm or more, more preferably free from a concave defect with a depth of 1.0 nm or more.

According to the smoothing method of the present invention, serious worsening of flatness giving rise to a problem in the production of a mask blank for EUVL or a mirror for EUVL is not produced by the irradiation of an excimer laser on the optical surface. Specifically, the flatness of the optical component after the excimer laser irradiation is preferably 50 nm or less, more preferably 30 nm or less, still more preferably 20 nm or less.

According to the smoothing method of the present invention, the optical surface can be smoothed by irradiating the optical surface with an excimer laser without causing deterioration in terms of surface roughness on the optical surface, which becomes a problem in the production of a mask blank for EUVL or a mirror for EUVL. Specifically, the surface roughness (RMS) on the optical surface after the excimer laser irradiation is preferably 0.15 nm or less, more preferably 0.12 nm or less, still more preferably 0.1 nm or less.

When the surface roughness (RMS) on the optical surface is 0.15 nm or less, the optical surface is sufficiently smooth and therefore, there is no possibility of causing disturbance in the reflective multilayer film formed on the optical surface. Disturbance caused in the reflective multilayer film may become a defect of the produced mask blank for EUVL or mirror for EUVL. Also, in the mask for EUVL produced using the mask blank for EUVL, the edge roughness of the pattern is small, and a pattern with good dimensional accuracy is obtained. If the surface roughness on the optical surface is large, the surface roughness of the reflective multilayer film formed on the optical surface and in turn, the surface roughness of the absorber layer formed on the reflective multilayer film become large. As a result, the pattern formed in the absorber layer comes to have a large edge roughness and the dimensional accuracy of the pattern becomes bad.

The surface roughness (RMS) on the optical surface after the excimer laser irradiation is preferably 0.1 nm or less.

In the optical component with the optical surface being smoothed by the smoothing method of the present invention, as described above, the fictive temperature of the surface layer containing the optical surface irradiated by the excimer laser rises and becomes high as compared with the fictive temperature of other sites of the optical component, that is, the inside of the optical component or the back surface side (surface layer containing the back surface) with respect to the optical surface. On the other hand, when the back surface is also irradiated by the excimer laser, the fictive temperature is high in the surface layer containing the optical surface and also in the surface layer containing the back surface, as compared with the inside of the optical component.

The elevation in the fictive temperature of the surface layer is expected to bring an effect of enhancing the mechanical strength of the surface layer, such as Young's modulus, fracture toughness value and fatigue characteristic.

In the smoothing method of the present invention, the irradiation with an excimer laser having a wavelength of 250 nm or less is carried out with a fluence of 0.5 to 2.0 J/cm² and therefore, a color center that is a local structural defect is formed in the surface layer containing the optical surface and the surface layer containing the back surface (when the back surface is also irradiated by the excimer laser).

In the optical component for EUVL of the present invention, a reflective multilayer film or an absorber layer is formed on the optical surface when producing a mask blank for EUVL or a mirror for EUVL and therefore, even when a color center is formed on the optical surface, this does not cause a problem in particular. Also, even when a color center is formed on the back surface, a problem is not caused at all in the use as a mask blank for EUVL or a mirror for EUVL.

EXAMPLES

Example A

One surface of a silica glass substrate containing $TiO_2$ as a dopant ($TiO_2$ concentration: 7.0 mass %) (produced by Asahi Glass Company, Ltd., Part No. AZ6025, 150 mm square) was manually rubbed with a wiper (cloth) of Bemcot or the like impregnated with a diamond paste having a particle diameter of 15 µm (15(W)35-MA, produced by HYREZ) to form scratches (scratch width: approximately from 2 to 5 µm) on the glass substrate surface.

An irradiation with a KrF excimer laser was carried out over the entire substrate surface where scratches were formed, by changing the irradiation fluence and the number of shots. The irradiation with the KrF excimer laser was carried out over the substrate surface in the form of a line beam (42 mm×0.55 mm) by using a cylindrical lens as an irradiation optical system, and the substrate surface was moved relative to the line beam, whereby the entire substrate surface was irradiated by the KrF excimer laser. The PV value (depth of concave defect (scratch)) and surface roughness (Ra value) on the substrate surface before and after the irradiation were measured using an interferometric measuring system. The results are shown in the Table below. In the Table below, the concave defect depth repair rate was determined according to the following formula:

Concave defect depth repair rate (%)=((depth of concave defect (PV value) before excimer laser irradiation)−(depth of concave defect (PV value) after excimer laser irradiation))/(depth of concave defect (PV value) before excimer laser irradiation)×100.

TABLE 1

| | Number of Shots | Irradiation Fluence (J/cm$^2$) | Ra Before Irradiation (nm) | Ra After Irradiation (nm) | PV Before Irradiation (nm) | PV After Irradiation (nm) | Concave Defect Depth Repair Rate (%) |
|---|---|---|---|---|---|---|---|
| Example 1 | 10 | 0.9 | 2.7 | 0.97 | 21.2 | 9.53 | 55.1 |
| Example 2 | 10 | 1.1 | 2.5 | 0.36 | 20.8 | 3.74 | 82.0 |
| Example 3 | 20 | 0.9 | 2.7 | 0.46 | 20.3 | 4.90 | 75.9 |
| Example 4 | 20 | 1.1 | 2.6 | 0.48 | 21.0 | 3.92 | 81.3 |
| Example 5 | 50 | 0.9 | 3.1 | 0.52 | 24.0 | 6.82 | 71.6 |
| Example 6 | 50 | 1.1 | 3.4 | 0.76 | 24.5 | 7.19 | 70.7 |
| Example 7 | 10 | 0.5 | 2.63 | 2.13 | 19.6 | 19.5 | 0.5 |
| Example 8 | 20 | 0.5 | 3.03 | 2.35 | 22.3 | 19.7 | 11.7 |
| Example 9 | 50 | 0.5 | 2.45 | 2.08 | 19.7 | 14.5 | 26.4 |

In all of Examples 1 to 9, the depth of the concave defect (scratch) present on the substrate surface could be reduced without worsening the surface roughness of the substrate surface. Above all, in Examples 1 to 6 where the irradiation fluence of the excimer laser was 0.9 J/cm$^2$ or 1.1 J/cm$^2$, the concave defect repair rate was 50% or more and was excellent in particular.

Scratches were formed on one surface of a glass substrate by the same procedure as above, and the entire substrate surface where scratches were formed was irradiated by a KrF excimer laser, by changing the irradiation fluence and the number of shots. The irradiation with the KrF excimer laser was carried out over the substrate surface in the form of a line beam (42 mm×0.55 mm) by using a cylindrical lens as an irradiation optical system, and the line beam was moved relative to the substrate surface, whereby the entire substrate surface was irradiated the KrF excimer laser. The fictive temperature of the excimer laser-irradiated surface and the fictive temperature of the back surface opposite to the irradiated surface were determined by measuring the FTIR spectra of these surfaces.

Figure 2:
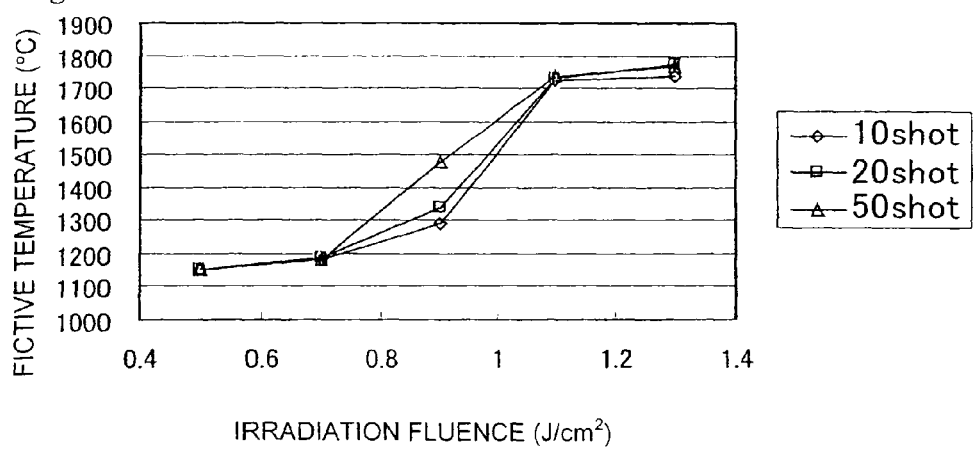
FIG. 2 is a graph illustrating the irradiation fluence dependency of the fictive temperature of the excimer laser-irradiated surface.
Figure 3:
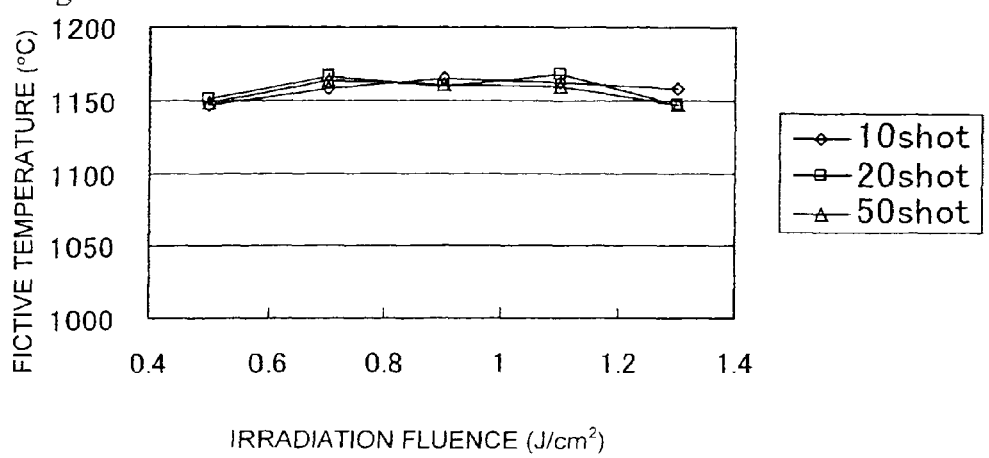
FIG. 3 is a graph illustrating the irradiation fluence dependency of the fictive temperature of the back surface with respect to the excimer laser-irradiated surface.

The peak of the FTIR spectrum of the silica glass material, for example, the peak showing Si—O—Si stretching, is known to differ according to the fictive temperature of the silica glass material. A plurality of samples differing in the fictive temperature were prepared by using a silica glass material having the same composition as the glass substrate above, and the FTIR spectrum of each sample surface was measured. The wave number (cm$^{-1}$) of the peak showing the Si—O—Si stretching obtained was plotted with relation to the fictive temperature (° C.) and it was confirmed that there is a linear correlation between these two factors. Using the plots as a calibration curve, the fictive temperatures of the excimer laser-irradiated surface and back surface of the glass substrate were determined from the wave number (cm$^{-1}$) showing the Si—O—Si stretching obtained by the FTIR spectrum measurement of the excimer laser-irradiated surface and back surface of the glass substrate. The results were shown in FIGS. 2 and 3. In addition, the fictive temperature of the glass substrate before the excimer laser irradiation was 1,150° C.

Example B

A plurality of pits (concave defect) present on one surface (optical surface) of a silica glass substrate containing TiO$_2$ as a dopant (TiO$_2$ concentration: 7.0 mass %, 150 mm square) were detected, and the depth of pit detected (PV value) was measured. Subsequently, with respect to a plurality of 20 mm-square regions containing the pits detected, similarly to Example A, the irradiation with a KrF excimer laser was carried out over the substrate surface in the form of a line beam (42 mm×0.55 mm) by using a cylindrical lens as an irradiation optical system, and the line beam was moved relative to the substrate surface. Here, the irradiation fluence and the number of shots were set to the conditions shown in Table 2. Thereafter, the depth of the same pit (PV value) was again measured. In addition, the measuring instrument in this Example B was an atomic force microscope.

The change in the pit depth between before and after the laser irradiation and the concave defect (pit) depth repair rate were shown in Table 2. Under these irradiation conditions, a concave defect (pit) depth repair rate of 50% or more could be obtained. In particular, in Example 12 (1.1 J/cm$^2$, 100 shots), the concave defect depth repair rate was 100% and the pit was completely eliminated.

TABLE 2

| | Irradiation Fluence (J/cm$^2$) | Number of Shots | Pit Depth (PV Value) | | Concave Defect Depth Repair Rate (%) |
| | | | Before Irradiation (nm) | After Irradiation (nm) | |
|---|---|---|---|---|---|
| Example 10 | 1.00 | 20 | 18.7 | 8.7 | 53.5 |
| Example 11 | 1.05 | 50 | 24.6 | 9.1 | 63.0 |
| Example 12 | 1.10 | 100 | 8.7 | 0.0 | 100 |

Example C

A plurality of pits (concave defect) present on one surface (optical surface) of a silica glass substrate containing $TiO_2$ as a dopant ($TiO_2$ concentration: 7.0 mass %, 150 mm square) are detected, and the depth of pit detected (PV value) and RMS on the periphery are measured. Subsequently, with respect to a plurality of 20 mm-square regions containing the pits detected, similarly to Example A, the irradiation with a KrF excimer laser is carried out over the substrate surface in the form of a line beam (42 mm×0.55 mm) by using a cylindrical lens as an irradiation optical system, and the line beam is moved relative to the substrate surface. Here, the irradiation fluence and the number of shots are set to the conditions shown in Table 3. Thereafter, the depth of the same pit (PV value) and RMS on the periphery are again measured. In addition, the measuring instrument in this Example C is an atomic force microscope.

The change in the pit depth between before and after the laser irradiation, the concave defect (pit) depth repair rate and RMS on the periphery of the pit after irradiation are shown in Table 3. Under these irradiation conditions, the concave defect (pit) depth repair rate is 50% or more, the pit depth after the irradiation is 2 nm or less, and RMS on the periphery of the pit is 0.15 nm or less.

TABLE 3

| | Irradiation Fluence (J/cm²) | Number of Shots | Pit Depth (PV Value) Before Irradiation (nm) | Pit Depth (PV Value) After Irradiation (nm) | Concave Defect Depth Repair Rate (%) | RMS (nm) |
|---|---|---|---|---|---|---|
| Example 13 | 1.1 | 200 | 10.9 | 2 | 81.7 | 0.14 |
| Example 14 | 1.1 | 200 | 12.5 | 0 | 100 | 0.15 |

While the invention has been described in detail and with reference to specific embodiments thereof, it will be apparent to one skill in the art that various changes and modifications can be made therein without departing from the sprit and scope thereof.

This application is based on Japanese patent applications No. 2008-037531 filed on Feb. 19, 2008 and No. 2008-299647 filed on Nov. 25, 2008, the entire contents of which are incorporated hereinto by reference. All references cited herein are incorporated in their entirety.

The invention claimed is:

1. A method for smoothing an optical surface of an optical component for EUVL, comprising
irradiating, with an excimer laser having a wavelength of 250 nm or less with a fluence of 0.5 to 2.0 J/cm², an optical surface having a concave defect of an optical component for EUV lithography (EUVL), the optical component being made of a $TiO_2$-containing silica glass material comprising $SiO_2$ as a main component.

2. The smoothing method as claimed in claim 1, wherein the irradiation with the excimer laser is carried out with a fluence of 0.7 to 2.0 J/cm², thereby attaining a concave defect depth repair rate of the optical surface, defined by the following formula, being 50% or more:

Concave defect depth repair rate (%)=((depth of concave defect (PV value) before excimer laser irradiation)−(depth of concave defect (PV value) after excimer laser irradiation))/(depth of concave defect (PV value) before excimer laser irradiation)×100.

3. The smoothing method as claimed in claim 1, wherein the optical surface has a concave defect with a depth of more than 2 nm and 10 nm or less, and
wherein the irradiation with the excimer laser is carried out with a fluence of 0.7 to 2.0 J/cm², thereby obtaining an optical component for EUVL satisfying the following requirements (1) to (3):
(1) the optical surface after the excimer laser irradiation is free from a concave defect with a depth of more than 2 nm,
(2) the optical component after the excimer laser irradiation has a flatness of 50 nm or less, and
(3) the optical surface after the excimer laser irradiation has a surface roughness (RMS) of 0.15 nm or less.

4. The smoothing method as claimed in claim 1, wherein the excimer laser irradiation is carried out over the entire optical surface of the optical component.

5. The smoothing method as claimed in claim 1, wherein the optical component has a $TiO_2$ concentration of from 3 to 10 mass %.

6. The smoothing method as claimed in claim 1, wherein the excimer laser has a pulse width of 100 nsec or less.

7. The smoothing method as claimed in claim 1, wherein the excimer laser irradiation is carried out such that the number of shots at each irradiation area becomes 10 or more.

8. The smoothing method as claimed in claim 1, wherein the excimer laser for the irradiation is in the form of a line beam, and the excimer laser irradiation is carried out while scanning the optical surface with the line beam either by moving the line beam relative to the optical surface or by moving the optical surface relative to the line beam.

9. The smoothing method as claimed in claim 1, further comprising irradiating a back surface of the optical surface opposite to the optical surface with an excimer laser having a wavelength of 250 nm or less with a fluence of 0.5 to 2.0 J/cm².

10. The smoothing method as claimed in claim 9, wherein the excimer laser irradiation of the back surface is carried out over the entire back surface.

11. The smoothing method as claimed in claim 9, satisfying the relationship of the following formula:

$$0.5 \leq F_1/F_2 \leq 1.5$$

wherein $F_1$ represents the fluence in the excimer laser irradiation of the optical surface, and $F_2$ represents the fluence in the excimer laser irradiation of the back surface.

12. The smoothing method as claimed in claim 9, wherein the excimer laser for the irradiation of the back surface has a pulse width of 100 nsec or less.

13. The smoothing method as claimed in claim 9, wherein the excimer laser irradiation of the back surface is carried out such that the number of shots at each irradiation area becomes 10 or more.

14. The smoothing method as claimed in claim 9, wherein the excimer laser for the irradiation of the back surface is in the form of a line beam, and the excimer laser irradiation of the back surface is carried out while scanning the back surface with the line beam either by moving the line beam relative to the back surface or by moving the back surface relative to the line beam.

15. The smoothing method as claimed in claim 1, wherein the excimer laser irradiation of the optical surface is carried out in the state of the optical component being heated at 100 to 1,050° C.

16. An optical component for EUVL obtained by the method claimed in claim 1, composed of a surface layer containing the optical surface, a surface layer containing the back surface, and the remaining inside part, wherein the surface layer containing the optical surface has a fictive temperature that is higher by 30° C. or more than fictive temperatures of the surface layer containing the back surface and of the remaining inside part.

17. An optical component for EUVL obtained by the method claimed in claim 9, composed of a surface layer containing the optical surface, a surface layer containing the back surface, and the remaining inside part, wherein the surface layer containing the optical surface and the surface layer containing the back surface each has a fictive temperature that is higher by 30° C. or more than a fictive temperature of the remaining inside part.

* * * * *